(12) United States Patent
Lu (10) Patent No.: US 7,719,681 B2
(45) Date of Patent: May 18, 2010

(54) APPARATUS AND METHOD FOR MEASURING VAPOR FLUX DENSITY

(75) Inventor: Chih-shun Lu, Los Altos, CA (US)

(73) Assignee: Inficon, East Syracuse, NY (US)

(*) Notice: Subject to any disclaimer, the term of this patent is extended or adjusted under 35 U.S.C. 154(b) by 420 days.

(21) Appl. No.: 11/871,708

(22) Filed: Oct. 12, 2007

(65) Prior Publication Data
US 2009/0095616 A1    Apr. 16, 2009

(51) Int. Cl.
*G01J 3/28* (2006.01)
(52) U.S. Cl. .......................... 356/326; 216/60
(58) Field of Classification Search ............. 356/326; 216/60; 118/712
See application file for complete search history.

(56) References Cited

U.S. PATENT DOCUMENTS

| | | | | |
|---|---|---|---|---|
| 3,609,378 A | * | 9/1971 | Smith, Jr. ................ | 250/564 |
| 3,612,859 A | * | 10/1971 | Schumacher ............. | 250/307 |
| 4,036,167 A | * | 7/1977 | Lu ........................... | 118/664 |
| 5,880,823 A | | 3/1999 | Lu | |
| 6,259,765 B1 | | 7/2001 | Baptist | |

2003/0128369 A1    7/2003  Hill

OTHER PUBLICATIONS

Kubiak et al., "Improved flux control from the Sentinel III electron impact emission spectroscopy system", Jul. 1991, J. Vacuum Science Technology, A 9, pp. 2423-2425.*

Lu et al., "Rate controlling and composition analysis of alloy deposition processes by electron impact emission spectroscopy (EIES)", Jan. 1977, J. Vacuum Science Technology, vol. 19, pp. 103-107.*

* cited by examiner

*Primary Examiner*—Kara E Geisel
(74) *Attorney, Agent, or Firm*—Samuel M. Freund; Cochran Freund & Young LLC (57) ABSTRACT

A two-chamber electron impact emission sensor effective for monitoring vapor flux of materials in the presence of interfering species is described. The sensor includes two independent electron excitation regions and one photodetector for monitoring emission from excited species from both chambers. Copper vapor flux from an evaporation source was accurately measured in the presence of interfering $H_2O$ vapor, and Ga vapor flux from an evaporation source was accurately monitored in the presence of interfering $CO_2$ gas. The invention permits deposition rates to be monitored using electron-impact emission spectroscopy with significantly improved accuracy in the presence of interfering gases at high partial pressures.

16 Claims, 7 Drawing Sheets

APPARATUS AND METHOD FOR MEASURING VAPOR FLUX DENSITY

FIELD OF THE INVENTION

The present invention relates generally to apparatus and method for accurate measurement and control of vapor flux density and, more particularly, to an electron-impact emission spectroscopy sensor for measuring vapor flux density of species having reduced interference from background gases and which can be directly correlated to the deposition rate in physical vapor deposition processes.

BACKGROUND OF THE INVENTION

Electron-impact emission spectroscopy (EIES) is a versatile technique for monitoring the vapor flux density in a vacuum environment by measuring characteristic photon emission from such species. The EIES technique may monitor multiple materials simultaneously using a single sensor which makes EIES useful for fabricating thin film products such as high-temperature superconductors, compound semiconductor devices, and solar cells, as examples. More specifically, EIES may be used for controlling film composition during co-deposition processes for the fabrication of multi-component thin film materials including the high-efficiency CIGS (copper-indium-gallium-diselenide) photovoltaic cells, as an example.

One or more outer shell electrons of vapor phase atomic or molecular species may be excited to higher energy levels when these species are subjected to bombardment by low-energy electrons. Such excited electrons emit photons having specific energies when returning to lower energy states which are characteristic of the atomic or molecular species. Further, the intensity of a particular emission line is proportional to the particle number density of the species generating this line. The measured intensity may therefore be converted to a deposition rate in the situation where the emitted photons are emitted from a flux of atoms or molecules being deposited on a substrate.

Emission spectra of most species consist of multiple lines and/or bands. The high specificity of EIES for atomic species derives from the unique emission spectrum of each element and the narrow widths of atomic emission lines. Well-spaced, non-overlapping emission lines may generally be allocated to different atomic species. For practical reasons, the preferred emission line is typically the one with the strongest intensity.

By contrast, the electron-impact emission spectra of many molecular species are often broadband in nature. When optical emission from an EIES sensor is measured using a wavelength selection device having a chosen resolution, such as an optical filter or monochromator, as an example, the emissions from common residual gases may interfere with those from the vapor flux and cause erroneous flux measurements. Such interference is most pronounced when measuring low-flux densities in the presence of gases such as are present in reactive deposition processes.

SUMMARY OF THE INVENTION

Accordingly, it is an object of the present invention to provide an EIES sensor for accurately monitoring vapor fluxes of chosen species under poor vacuum conditions.

Another object of the invention is to provide an EIES sensor for accurately monitoring vapor fluxes of chosen species in evaporation processes that require the introduction of gases at high partial pressures.

Yet another object of the invention is to provide an EIES sensor for accurately monitoring vapor fluxes of chosen species under variable vacuum conditions.

Additional objects, advantages and novel features of the invention will be set forth in part in the description which follows, and in part will become apparent to those skilled in the art upon examination of the following, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the apparatus for monitoring vapor flux density of a species in a vacuum chamber by electron-impact emission spectroscopy in the presence of background gas species, hereof, includes in combination: a first chamber disposed within the vacuum chamber having opposing apertures through which the species flux and background gas species can enter and exit the first chamber, and an aperture through which light can emerge from the first chamber; a first source of electrons disposed within the first chamber, wherein the electrons intersect the flux of the species, and wherein the electrons have a first chosen energy effective for exciting the species such that light is emitted therefrom; a first power source for providing electrical power to the first source of electrons; a second chamber disposed within the vacuum chamber having an aperture through which the background gas species can enter the second chamber, and opposing apertures through which light emerging from the aperture in the first chamber enters the second chamber, and light from the first chamber and light from the second chamber exits the second chamber; a second source of electrons disposed within the second chamber, wherein the electrons intersect the background gas species, and wherein the electrons have a second chosen energy effective for exciting the background gas species such that light is emitted therefrom; a second power source for providing electrical power to the second source of electrons; a wavelength selection apparatus for receiving light exiting the second chamber and for selecting a chosen wavelength range therefrom; and a photodetector for detecting light having a chosen wavelength range emerging from the wavelength selection apparatus, whereby light from the second chamber and light from the first chamber are processed such that the vapor flux density of the species is monitored.

In another aspect of the present invention and in accordance with its objects and purposes, the method for monitoring vapor flux density of a species in a vacuum chamber by electron-impact emission spectroscopy in the presence of background gas species, hereof, includes the steps of: directing a first source of electrons into the vapor flux of the species in the presence of the background gas species, wherein the electrons have a first chosen energy effective for exciting the flux species such that first emitted light is generated therefrom; directing a second source of electrons having a second chosen energy effective for exciting the background gas species into the background gas species away from the vapor flux such that second emitted light is generated therefrom; selecting a chosen wavelength range from the first emitted light and the second emitted light; detecting the first emitted light and the second emitted light having the chosen wavelength range; and processing the detected first emitted light and second emitted light such that the vapor flux density of the species is monitored.

Benefits and advantages of the present invention include, but are not limited to, improving the utility of EIES for monitoring species flux density in poor and/or variable vacuum conditions or for evaporation processes that require the introduction of reactive gases at relatively high partial pressures. Additionally, the present two-chamber EIES sensor provides the capability of allowing a user to select emission lines for the optimal signal-to-noise ratio in the output signal.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 2A is a schematic representation of a side view of one embodiment of the two-chamber EIES sensor of the present invention, while

DETAILED DESCRIPTION OF THE INVENTION

Briefly, the present invention includes an electron-impact emission spectroscopy, EIES, sensor having two electron-impact excitation sources in separate chambers with a common port for measuring the optical emission, wherein the vapor flux of a species being monitored is permitted to pass through one of the chambers. Interfering emission signals from background gases can be significantly reduced in the output signal of the EIES monitor for process control using a repetitive three-state excitation process and appropriate signal processing. As will be described in more detail hereinbelow, the present EIES sensor eliminates interference by background gases such as $CO_2$ and $H_2O$ present at pressures in the high $10^{-5}$ Torr range in the evaporation of Ga and Cu, respectively.

Figure 1:
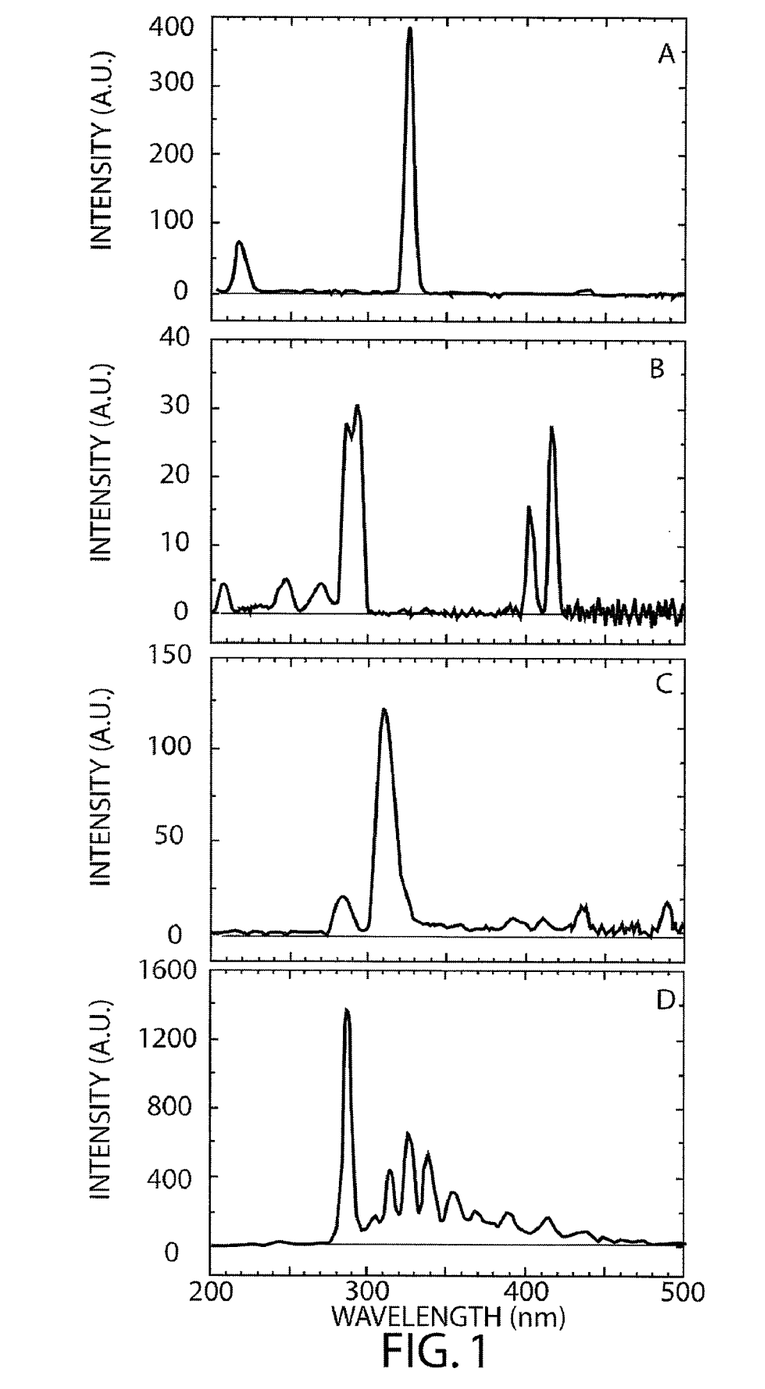
FIGS. 1A-1D show electron-impact emission spectra of Cu, Ga, $H_2O$, and $CO_2$, respectively, between 200 nm and 500 nm at a spectral resolution of about 6 nm.

Typical emission spectra for atomic species consist of separated lines having narrow line widths. Individual lines or a group of lines, from atomic emission may be selected for measurement using a wavelength selection device having a chosen resolution. Non-interfering lines between different atomic species may also be found. As examples, the emission spectra of Cu and Ga in the range between 200 nm and 500 nm are shown in FIGS. 1A and 1B, respectively. The resolution for these spectra is about 6 nm which bandwidth is representative of the bandwidth for the wavelength selection device employed in typical EIES instruments. Although some of the closely spaced emission lines for each material cannot be resolved with such resolution, for example, the 324.7 and 327.4 nm emission lines for Cu and the 287.0 and 294.4 nm lines for Ga, the Cu emission lines can readily be separated from the Ga emission lines and, in the absence of other species, an EIES monitor is capable of measuring the vapor flux both qualitatively and quantitatively.

However, the emission spectra of most molecular species, including many of the common residual gases found in vacuum deposition systems, consist of large numbers of closely spaced emission lines over broad ranges, and may appear as emission bands. Such broad emission bands may overlap with the emission lines from the evaporated species. FIGS. 1C and 1D show the emission spectra of $H_2O$ ($2\times10^{-5}$ Torr measured with an ion gauge) and $CO_2$ ($2\times10^{-5}$ Torr measured with an ion gauge), common background gases in vacuum systems, respectively, in the range between 200 nm and 500 nm and at a resolution of approximately 6 nm. It may be observed that the strong $CO_2^+$ emission at 289 nm interferes with Ga emission lines at 287.0 and 294.4 nm, while both the OH and $CO_2^+$ emission bands in the region of 325 nm overlap with the 324.7/327.4 nm Cu emission lines, thereby preventing the EIES photodetector from distinguishing the signal from the vapor flux from that of the residual gases. As a result, the accuracy and sensitivity of measurements are significantly reduced, especially when the partial pressure of residual gases is high and unstable.

Figure 2A:
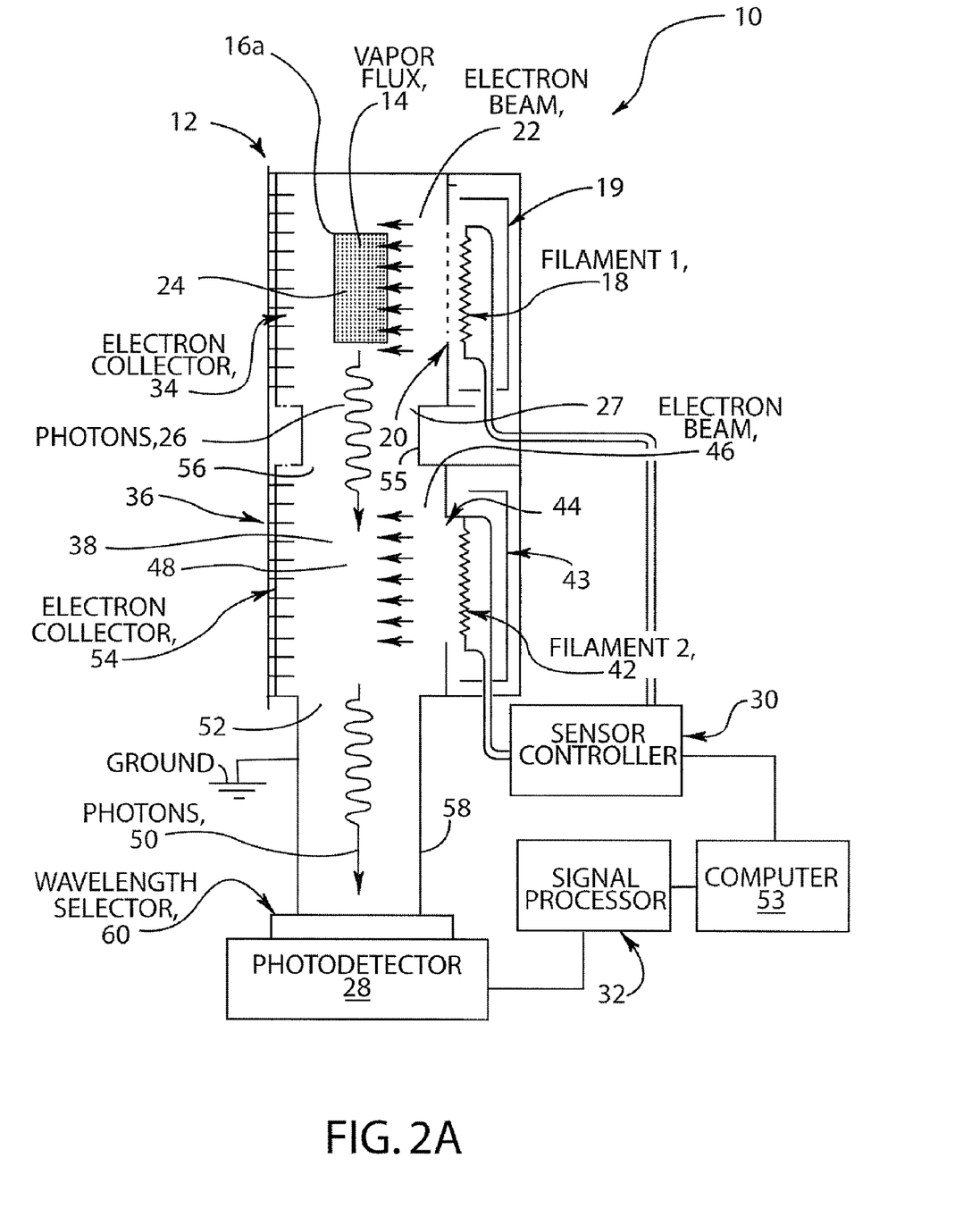
Figure 2B:
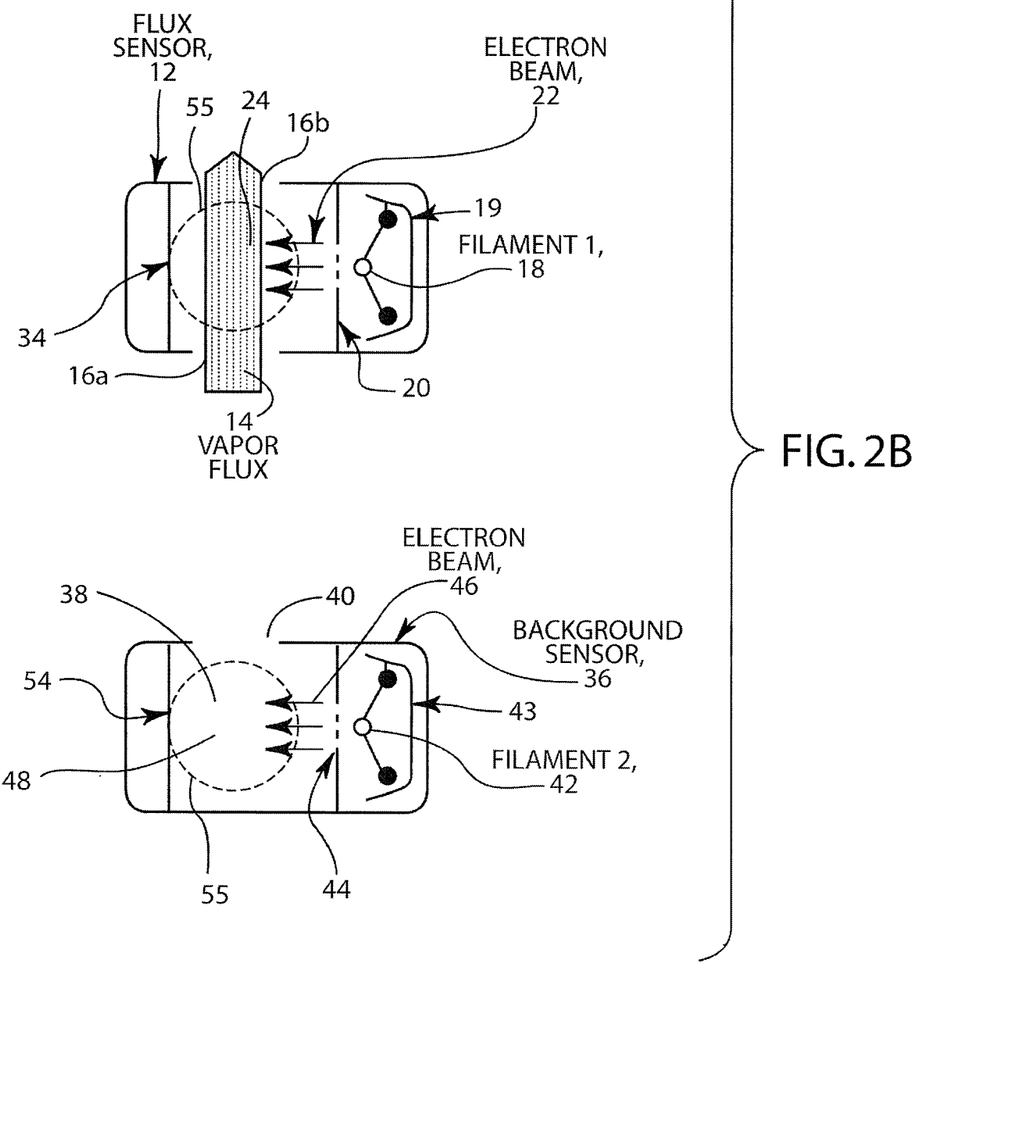
FIG. 2B is a schematic representation of a top view of each of the two EIES chambers illustrated in FIG. 2A hereof.

Reference will now be made in detail to the present embodiments of the invention, examples of which are illustrated in the accompanying drawings. In the Figures, similar structure will be identified using identical reference characters. Turning now to FIG. 2A, a schematic representation of a side view of one embodiment, 10, of the two-chamber EIES sensor of the present invention is shown, while FIG. 2B shows schematic representations of a top view of each of the two chambers illustrated in FIG. 2A hereof. First sensor chamber, 12, for monitoring vapor flux density, 14, has two opposing apertures, 16a and 16b, for permitting the atomic and/or molecular flux to be monitored to enter and exit chamber 12, respectively. Background gases may also enter chamber 12 through these apertures. First filament, 18, biased at approximately −180 V with respect to the ground potential emits electrons. It should be mentioned that this potential may be from a few tens of volts to hundreds of volts. Filament shield, 19, prevents electrons from exiting rearward from first filament 18. Grounded grid and aperture, 20, accelerates and shapes low-energy (~180 eV) electron beam, 22. Electron beam 22 intersects the vapor flux 18 in region, 24. Photons, 26, generated in this region, exit through port, 27, and are detected by photodetector, 28, located outside the vacuum chamber containing sensor 10, not shown in FIGS. 2A and 2B. The emission current from filament 18 is regulated and electronically chopped by sensor controller, 30, to enable standard modulated signal processing procedures for eliminating ambient photons using signal processor, 32. Electrons passing through region 24 strike electron collector, 34, which may be a metal structure in the form of a louver or a honeycomb to reduce secondary electron emission.

Second sensor chamber, 36, for monitoring background gases, 38, has aperture, 40, for permitting background gases to enter. First chamber 12 is also exposed to these gases. Second filament, 42, biased at about −180 V with respect to the ground potential emits electrons. It should be mentioned that this potential may be from a few tens of volts to hundreds of volts. Filament shield, 43, prevents electrons from exiting rearward from second filament 42. Grounded grid and aperture, 44, accelerates and shapes low-energy (~180 eV) electron beam, 46. Electron beam 46 intersects background gases 38 in region, 48. Photons, 50, generated in this region exit port, 52, and are detected by photodetector, 28, located outside the vacuum chamber containing sensor 10, not shown in FIGS. 2A and 2B. The emission current from filament 42 is regulated and electronically chopped by sensor controller, 30, to enable standard modulated signal processing procedures for eliminating background photons using signal processor, 32, both sensor controller 30 and signal processor 32 being controlled by computer, 53. Electrons passing through region 48 strike electron collector, 54, which may be a metal structure in the form of a louver or a honeycomb to reduce secondary electron emission.

Filaments 18 and 42 may be separately biased to permit independent operation for each chamber. Chamber 12 has apertures 16a and 16b oriented in a direction adapted permit vapor flux 14 to pass through. As stated hereinabove, background (residual) species may also freely enter this chamber. Thus, in chamber 12, the optical emissions include those from the vapor flux of the species to be monitored and background species which include background pressures of the atoms or molecules of the species for which the flux density is being monitored resulting from scattering of these species in the vacuum chamber employed. Background species may also include reactive gases, typically oxygen and nitrogen, introduced into the vacuum chamber, as may be required by a specific deposition process. In particular, the present two-chamber EIES sensor has been found to be effective for eliminating the interference from nitrogen in a reactive evaporation process.

Chamber 36 of sensor 10 only permits residual gases to gain entry thereto, and optical emissions generated in chamber 36 are therefore from these residual gases. As illustrated in FIG. 2A, chambers 12 and 36 are disposed in tandem, connected by short tube, 55, with exit port 27 of chamber 12 aligned with entrance port, 56, of chamber 36 and with exit port 52 of chamber 36, thereby permitting a portion of the photons generated in chamber 12 and/or chamber 36 to enter hollow tube, 58. Photodetector 28 disposed at or near the end of tube 58 behind an appropriate wavelength selection device, 60, generally a narrow bandpass filter, may therefore measure the optical outputs from both chambers.

Sensor controller 30 provides electrical power to energize filaments 18 and 42 for electron emission; provides a sufficiently high potential between filaments 18 and 42 and grids 20 and 44, respectively, for generating energetic electrons for commencing the electron impact emission process; regulates the electron emission current to keep it at a preset level; and switches the electron emission current in each chamber on and off by modulating the bias voltage applied to each filament so that the optically emission generated from each section can be modulated, as will be described in more detail hereinbelow.

Figure 3:
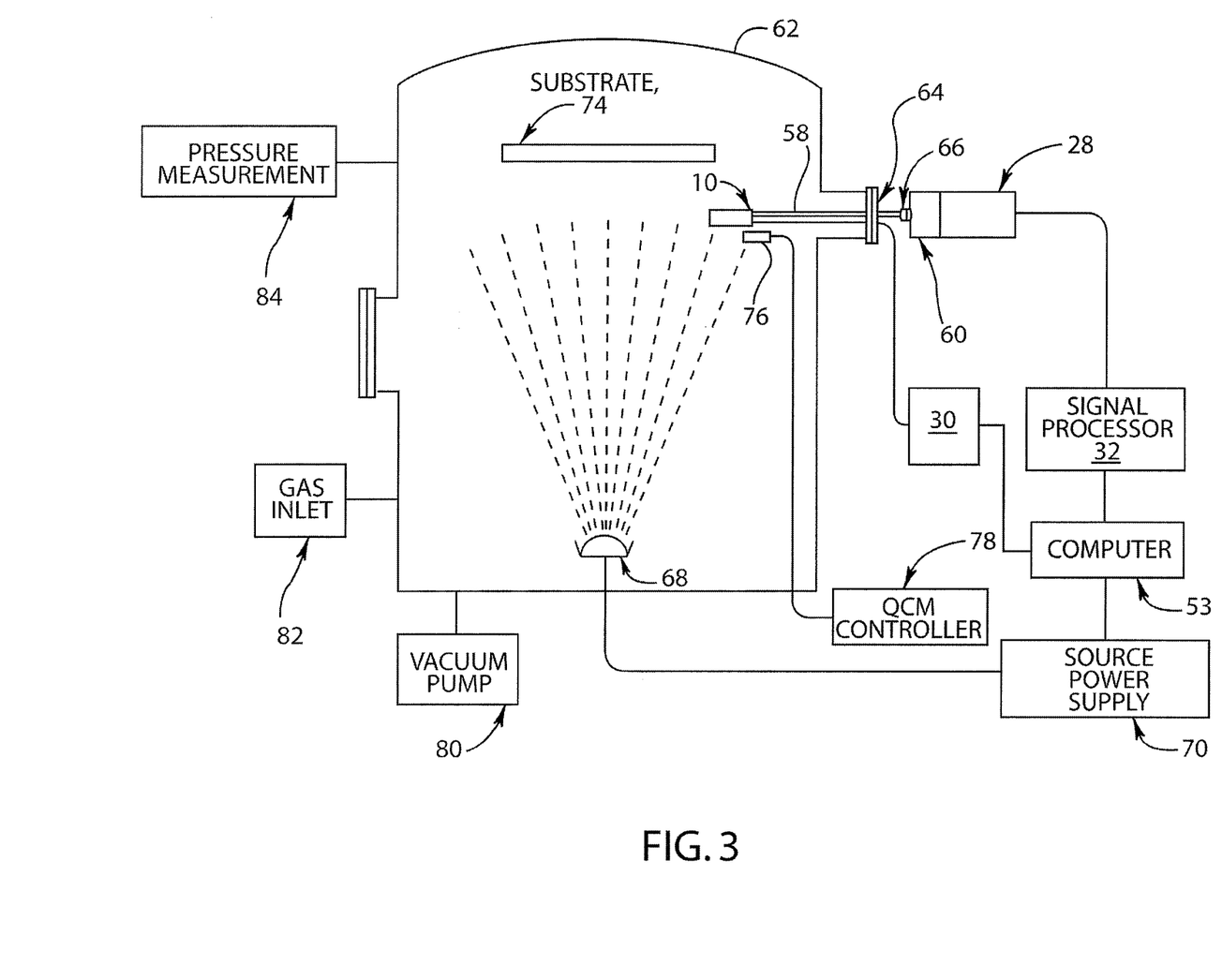
FIG. 3 is a schematic representation of the two-chamber EIES sensor illustrated in FIGS. 2A and 2B hereof disposed in a vacuum deposition system.

FIG. 3 is a schematic representation of two-chamber EIES sensor 10 hereof disposed in vacuum deposition apparatus 62. Here, light emitted from sensor 10 is transmitted through tube 58 which passes through vacuum feedthrough, 64, and terminates in optical window, 66, through which the light exits vacuum deposition apparatus 62. Feedthrough 64 may also have electrical connections for driving filaments 18 and 42. External to optical window 66, the emitted light is collected by photodetector 28 after passing through wavelength selection device 60. Wavelength selection device 60 may be a band pass optical filter or a monochromator serving to pass only those wavelengths of the emitted light indicative of the component of the vapor flux that is to be measured. A variety of photon detection devices having sufficient sensitivity may be used for photodetector 28 to measure the intensity of the filtered light. As an example, a photo-multiplier (PMT) having appropriate spectral response may be employed.

Signal processor 32, evaporation source, 68, and evaporation source power supply, 70, may be controlled by computer, 53, as will be understood by those skilled in the technology. Modulated output signal from photodetector 28 is processed using signal processor 32 and directed to computer 53 where signals suitable for display and feedback control purposes are generated. As stated, output from computer 53 may be directed to evaporation source power supply 70 for controlling the evaporation rate of source 68, and thus the deposition rate onto substrate, 74.

Quartz crystal microbalance (QCM), 76, controlled by QCM control, 78, may be employed for calibrating sensor 10.

Other supporting apparatus for chamber 62 include, for example, vacuum pump, 80, gas inlet and control, 82, and pressure measurement device, 84.

Figure 4:
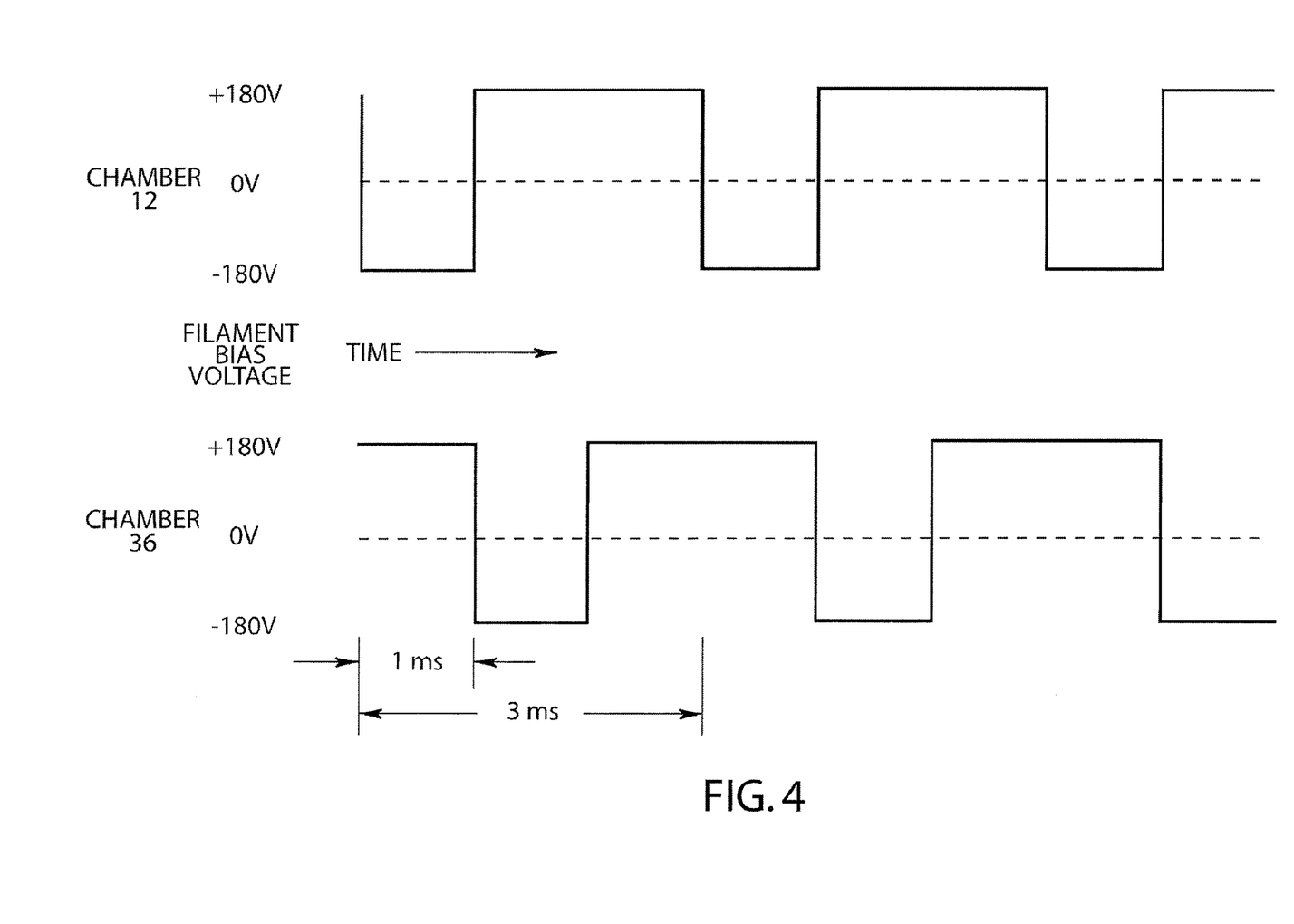
FIG. 4 shows a filament bias timing diagram for a measurement sequence using the two-chamber EIES sensor apparatus described in FIGS. 2A and 2B hereof, where the electron beam is switched on when a filament is biased at −180 V, and switched off when a filament is biased at +180 V in each chamber.

In order to separate the optical signal due to evaporated vapor flux from that due to residual gases, the two-chamber EIES sensor excitation procedure shown in FIG. 4 and TABLE 1 was used for filaments 18 and 42, where electron impact excitation takes place when a filament is biased at −180 V with respect to the grounded grid, and is terminated when a filament is biased at +180 V. The waveforms and the timing relationship thereof are in shown in FIG. 4 as having square profiles. One cycle of sensor operation consists of three states each state occupying one-third of a cycle period.

TABLE 1

Filament Operating Cycle

| State | Filament 1 (18) | Filament 2 (42) |
|---|---|---|
| 1 | On | Off |
| 2 | Off | On |
| 3 | Off | Off |

To maintain the filament emission current at a constant and preset value, the leakage current between the filament and grid, or ground, must be known and compensated for. Leakage current typically results from coatings of scattered atomic and molecular species inside the sensor chambers, and may be determined when the filament is positively biased, assuming that the leakage current is the same for both positive and negative biases. The ±180 V used for modulating the filament bias potential is for the purpose of illustration since voltages effective for producing sufficient excitation electrons having energies suitable for exciting the atoms or molecules may be used. Since the positive voltages are used for checking leakage currents, their magnitudes do not have to be the same as the negative voltage applied.

For a selected spectral bandwidth, determined by the wavelength selection device, total signal outputs from the photo-detection system during the three states, I(1), I(2) and I(3), are given as follows:

$$I(1)=I_1(F)+I_1(G)+B(t) \tag{1}$$

$$I(2)=I_2(G)+B(t), \text{ and} \tag{2}$$

$$I(3)=B(t), \tag{3}$$

where $I_1$ and $I_2$ are output signals corresponding from the first chamber, and from the second chamber, respectively, F and G denote the origin of optical signals as either generated from the vapor flux or the residual gases respectively, and B represents the signal due to ambient radiation in the vacuum chamber that may be a function of time, t. The duration of each state is selected to be 1 ms. One cycle for accessing the 3 states therefore takes 3 ms. The reason for choosing a short measuring cycle is to enable the assumption that the background signal B(t) remains constant during each 3 ms cycle period to be made. Depending on the deposition process, other cycling times may be used.

Since the distances between the photo-detection system to the two sections are different, $I_1(G)$ generally is not equal to $I_2(G)$. In order to obtain the net signal due to the flux only, $I_1(F)$, a correction factor is required to equalize the residual gas signals $I_1(G)$ and $I_2(G)$. The correction factor may be determined by operating the EIES sensor in the absence of vapor flux, where $I_1(F)=0$, where Eq. (1) becomes $$I(1)_{F=0} = I_1(G) + B(t). \qquad (4)$$

Correction factor K is defined as:

$$K = I_1(G)/I_2(G). \qquad (5)$$

From Eqs. (2) to (4) and assuming that B(t) is a constant within the measurement cycle, K may be obtained from the following equation:

$$K = [I(1)_{F=0} - I(3)]/[I(2) - I(3)]. \qquad (6)$$

The correction factor K is related to the geometry of a specific optical arrangement, and is therefore a constant independent of the residual gas pressure which may be stored in the computer for future usage.

The net vapor flux signal $I_1(F)$ is obtained from the following equation:

$$I_S(F) = [I(1) - I(3)] - K[I(2) - I(3)]. \qquad (7)$$

Having generally described the invention, the following EXAMPLES provide additional detail.

The two-chamber EIES sensor described in FIGS. 2A and 2B hereof was tested in a vacuum deposition system having a leak valve and gas sources for varying the partial pressure of residual gases, as described in FIG. 3 hereof. Copper was evaporated at high partial pressure of water vapor and Ga was evaporated at high partial pressure of $CO_2$ to demonstrate the performance of the EIES sensor in the presence interfering gases. The Cu and Ga sources used were resistance-heated tungsten baskets having alumina coatings. A Quartz Crystal Monitor (QCM) was used for closed-loop control of the evaporation source for maintaining the deposition rate at a constant level. Before evaporation of materials, the vacuum chamber was evacuated to less than $5 \times 10^{-7}$ Torr as measured by an ionization gauge. After a steady deposition rate was established, water or $CO_2$ was introduced to a chosen pressure. No correction was made to the ionization gauge readings to compensate for differences in sensitivity to different gases.

The distance from the evaporation source to the two-chamber EIES sensor was twice the distance from the source to the QCM, making the deposition rate at the EIES sensor about ¼ of the rate at the QCM.

EXAMPLE 1

Figure 5:
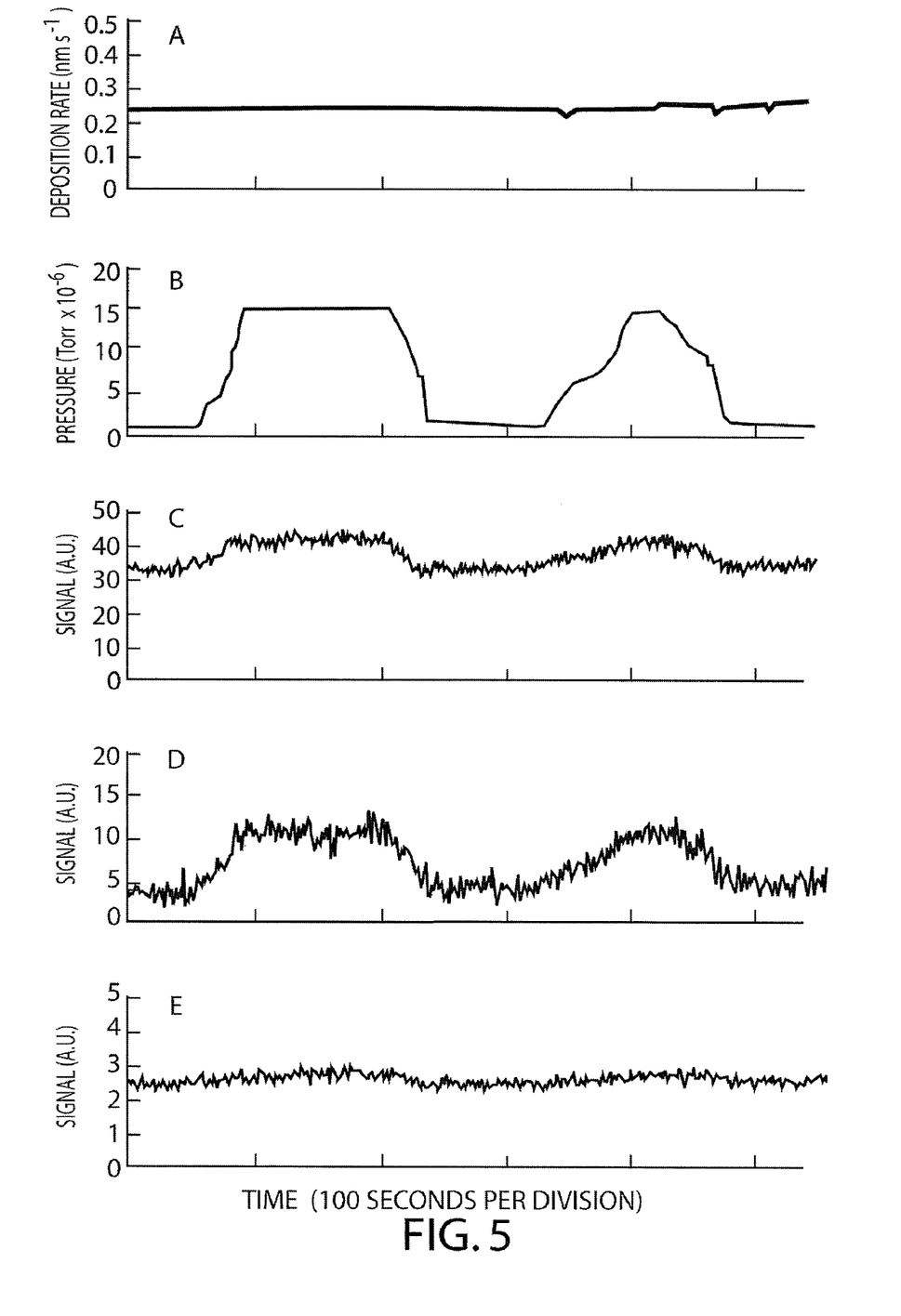
FIG. 5 illustrates the use of the two-chamber EIES apparatus described in FIGS. 2A and 2B hereof for making accurate measurements of Cu vapor flux in the presence of water vapor, when compared to measurements made using a QCM.

Using a bandpass filter having a center wavelength at 325 nm and a FWHM (full-width-at-half-maximum) of 10 nm, Cu emission lines were detected at 324.7 and 327.4 nm. The deposition rate measured at the QCM sensor was about 0.25 nm s$^{-1}$ as shown in FIG. 5A. During the evaporation process, water partial pressure was increased by more than one order of magnitude to $1.5 \times 10^{-5}$ Torr as indicated by the ionization gauge reading shown in FIG. 5B. FIG. 5C shows the output signal from the first chamber of the EIES sensor as a function of time. This measurement is the equivalent of a measurement using an existing EIES sensor. It may be observed that the superposition of the interfering gas signal (from OH) and the Cu flux signal renders the EIES output useless for monitoring the Cu deposition rate. However, with the addition of a second chamber to the EIES sensor, the interfering gas signal can be separately measured as shown in FIG. 5D. The output from the second chamber the two-chamber EIES sensor has a similar form to that from the ionization gauge shown in FIG. 5B, suggesting a possible application of the EIES sensor for partial pressure measurement. When Eq. (7) is used to correct for the interfering gas signal from the sum signal, the net flux signal for Cu can be obtained for interfering gas pressures varying over a significant range as shown in FIG. 5E.

EXAMPLE 2

Figure 6:
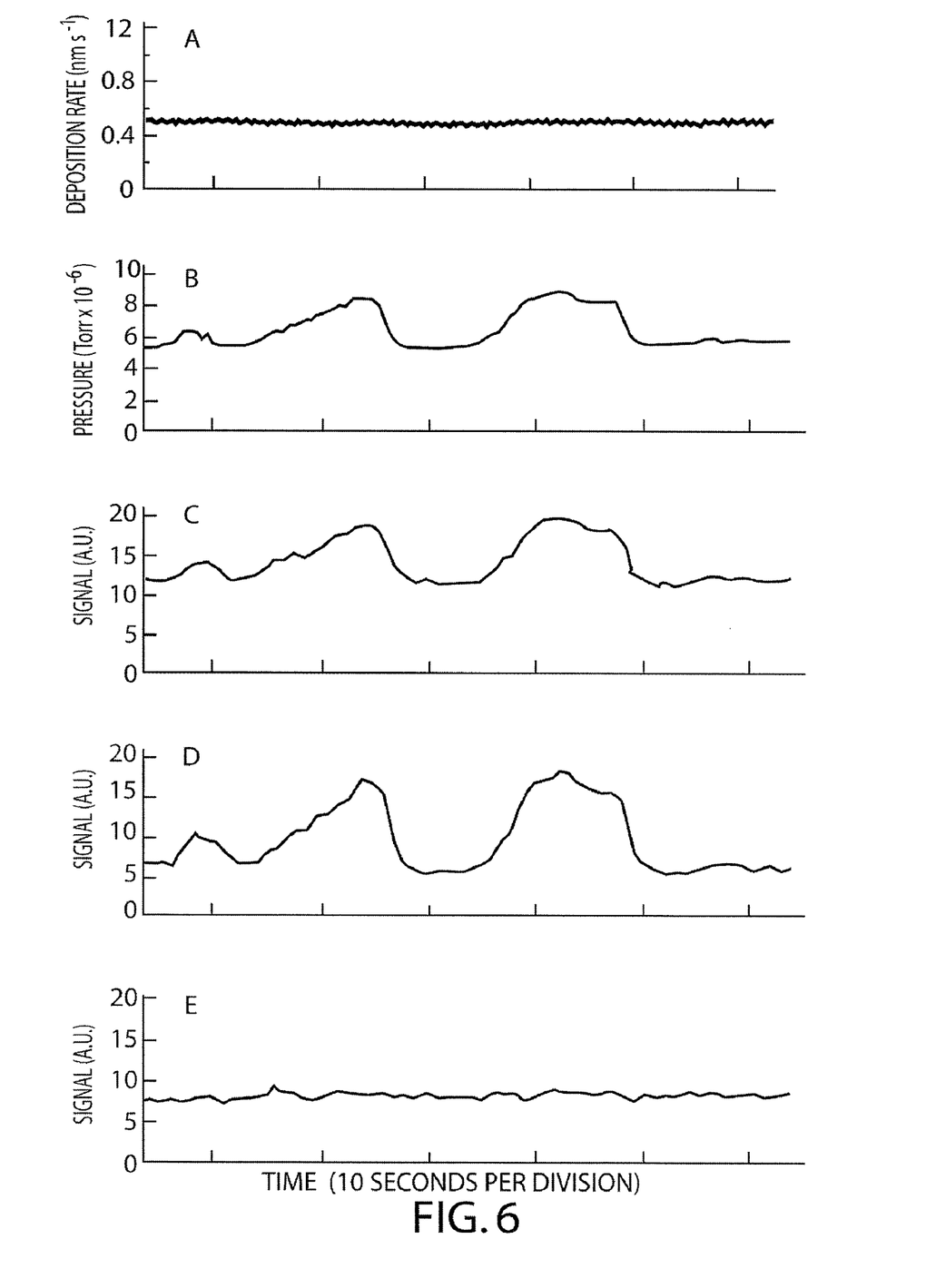
FIG. 6 illustrates the use of the two-chamber EIES apparatus described in FIGS. 2A and 2B hereof for making accurate measurements of Ga vapor flux in the presence of $CO_2$, when compared to measurements made using a QCM.

A Ga emission line at 294.4 nm was chosen to demonstrate the effectiveness of the present two-chamber EIES sensor in the presence of interfering gas signal ($CO_2^+$ emission bands from 287 to 290 nm) from $CO_2$ present during the deposition, as illustrated in FIG. 6 hereof. The optical filter used for the photo-detection system has a center wavelength at 294.4 nm and a FWHM of 2 nm. The deposition rate at the QCM was about 0.5 nm s$^{-1}$ (FIG. 6A) with $CO_2$ partial pressures varying between about $5 \times 10^{-6}$ Torr and $9 \times 10^{-6}$ Torr (FIG. 6B). The signals from chamber 1 and chamber 2 are shown in FIGS. 6C and 6D as a function of time. A Ga flux signal, free of interference from $CO_2$ gas, was obtained as shown in FIG. 6E.

Tests of the present two-chamber EIES sensor have been conducted using partial pressures of various interfering gases in the $10^{-4}$ Torr range, the upper pressure limits for the EIES sensor being imposed by pressure limitations on the proper functioning of the thermionic emitter (filament), and secondary effects related to the evaporation process, such as the scattering of evaporated materials, rather than the basic operational principle of the sensor.

Many materials have multiple emission lines such as shown in FIG. 1A for Ga and emission lines in spectral regions that do not have strong emissions from interfering gases may sometimes be located. For example, Ga has an emission line at 417.2 nm and the emission from $CO_2$ is weaker near this wavelength region than in the spectral region near the 294.4 nm Ga emission line [see, for example, FIGS. 1A and 1C, hereof]. Therefore, for high deposition rates of Ga and low partial pressures of $CO_2$, existing single-chamber EIES may provide useful measurements at a wavelength of 417 nm. In addition, one may observe from FIG. 1A that the noise level increases with increasing wavelength. This effect is more pronounced for wavelengths above 350 nm due to the increase in background radiation originating largely from the light emission by the sensor filament. Although the signal from continuous background radiation [B(t), in Eqs. (1)-(3), hereinabove] may be subtracted using the present signal processing procedure, noise generated by the photodetector is statistically additive and is proportional to the square root of the signal. Thus, the signal-to-noise (S/N) ratio decreases as the wavelength increases above 350 nm. For this reason, for approximately constant line intensity, an emission lines having shorter wavelengths are preferred.

Referring again to FIG. 1A, the emission intensity of Ga at 294.4 nm is approximately the same as that at 417.2 nm with the specific optical system used. However, for the same deposition rate, the S/N ratio at 294.4 nm is about 5 times better than that at 417.2 nm. The present two-chamber EIES sensor provides the capability of allowing the user to select any emission line for the optimal S/N ratios in the output signals.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for monitoring vapor flux density of a species in a vacuum chamber by electron-impact emission spectroscopy in the presence of background gas species, comprising in combination:
    a first chamber disposed within said vacuum chamber having opposing apertures through which said vapor flux and background gas species can enter and exit said first chamber, and an aperture through which light can emerge from said first chamber;
    a first source of electrons disposed within said first chamber, wherein the electrons intersect said vapor flux, and wherein the electrons have a first chosen energy effective for exciting said species in said vapor flux such that light is emitted therefrom;
    a first power source for providing electrical power to said first source of electrons;
    a second chamber disposed within said vacuum chamber having an aperture through which said background gas species can enter said second chamber, and a pair of opposing apertures through which light emerging from the aperture of said first chamber enters said second chamber, and light from said first chamber and light from said second chamber exits said second chamber;
    a second source of electrons disposed within said second chamber, wherein the electrons intersect said background gas species, and wherein the electrons have a second chosen energy effective for exciting said background gas species such that light is emitted therefrom;
    a second power source for providing electrical energy to said second source of electrons;
    a wavelength selection apparatus for receiving light exiting said second chamber and for selecting a chosen wavelength range therefrom; and
    a photodetector for detecting light having a chosen wavelength range emerging from said wavelength selection apparatus, whereby light from said second chamber and light from said first chamber are processed such that said vapor flux density of said species is monitored.

2. The apparatus of claim 1, wherein said wavelength selection apparatus is selected from the group consisting of optical filters and monochrometers.

3. The apparatus of claim 1, wherein said first chosen electron energy and said second chosen electron energy are equal.

4. The apparatus of claim 1, wherein said first source of electrons is pulsed on and off in accordance with a first time pattern by pulsing said first power source, and said second source of electrons is pulsed on and off in accordance with a second time pattern by pulsing said second power source, such that said light emitted from said first chamber and light emitted from said second chamber are temporally separated.

5. The apparatus of claim 4, wherein said first source of electrons comprises a first filament and a first grid, wherein said first source of electrons is pulsed on by applying a first negative voltage bias to said first filament relative to said first grid, and wherein said second source of electrons comprises a second filament and a second grid, wherein said second source of electrons is pulsed on by applying a second negative voltage bias to said second filament relative to said second grid.

6. The apparatus of claim 5, wherein said first grid and said second grid are maintained at ground potential, and the first bias voltage and the second bias voltage are approximately −180 V.

7. The apparatus of claim 1, wherein said vacuum chamber comprises a vacuum deposition apparatus.

8. The apparatus of claim 7, wherein said vapor flux comprises more than one species.

9. The apparatus of claim 7, wherein said background gas species comprise gases introduced into the vacuum deposition apparatus.

10. A method for monitoring vapor flux density of a species in a vacuum chamber by electron-impact emission spectroscopy in the presence of background gas species, comprising the steps of:
    directing a first source of electrons into the vapor flux of the species in the presence of the background gas species, wherein the electrons have a first chosen energy effective for exciting the species such that first emitted light is generated therefrom;
    directing a second source of electrons having a second chosen energy effective for exciting the background gas species into the background gas species away from the vapor flux such that second emitted light is generated therefrom;
    selecting a chosen wavelength range from the first emitted light and from the second emitted light;
    detecting the first emitted light and the second emitted light having a chosen wavelength range; and
    processing the detected first emitted light and second emitted light such that the vapor flux density of the species is monitored.

11. The method of claim 10, wherein said step of selecting a chosen wavelength range is achieved using apparatus selected from the group consisting of optical filters and monochrometers.

12. The method of claim 10, wherein the first source of electrons is pulsed on and off in accordance with a first time pattern, and the second source of electrons is pulsed on and off in accordance with a second time pattern, whereby the first emitted light and the second emitted light are temporally separated.

13. The method of claim 10, wherein the first chosen electron energy and the second chosen electron energy are equal.

14. The method of claim 10, wherein the vacuum chamber comprises a vacuum deposition apparatus.

15. The apparatus of claim 14, wherein the vapor flux comprises more than one species.

16. The apparatus of claim 14, wherein the background gas species comprise gases introduced into the vacuum deposition apparatus.

* * * * *